(12) United States Patent
Lee et al.

(10) Patent No.: US 8,994,063 B2
(45) Date of Patent: Mar. 31, 2015

(54) ORGANIC LIGHT EMITTING DIODE DISPLAY AND METHOD OF MANUFACTURING THE SAME

(75) Inventors: Jae-Seob Lee, Yongin (KR); Dong-Un Jin, Yongin (KR)

(73) Assignee: Samsung Display Co., Ltd. (KR)

( * ) Notice: Subject to any disclaimer, the term of this patent is extended or adjusted under 35 U.S.C. 154(b) by 342 days.

(21) Appl. No.: 12/946,710

(22) Filed: Nov. 15, 2010

(65) Prior Publication Data

US 2011/0114993 A1   May 19, 2011

(30) Foreign Application Priority Data

Nov. 16, 2009  (KR) .................. 10-2009-0110476

(51) Int. Cl.
H01L 33/00 (2010.01)
H01L 51/00 (2006.01)
H01L 51/52 (2006.01)
H01L 23/29 (2006.01)

(52) U.S. Cl.
CPC ............ H01L 51/003 (2013.01); H01L 51/524 (2013.01); H01L 51/529 (2013.01); H01L 23/29 (2013.01); H01L 2251/5338 (2013.01); H01L 2924/0002 (2013.01)
USPC .............. 257/100; 257/79; 257/680; 257/790

(58) Field of Classification Search
CPC ..................................................... H01L 51/50
USPC ............. 438/26–28, 126–127, 761, 780, 902, 438/928, 956, 35, 22; 257/79, 680, 790, 257/100, E21.502, E33.059
See application file for complete search history.

(56) References Cited

U.S. PATENT DOCUMENTS

| | | | | |
|---|---|---|---|---|
| 5,147,821 A | * | 9/1992 | McShane et al. | 264/272.17 |
| 5,427,858 A | * | 6/1995 | Nakamura et al. | 428/421 |
| 5,701,951 A | * | 12/1997 | Jean | 165/121 |
| 5,811,177 A | * | 9/1998 | Shi et al. | 428/209 |
| 5,962,962 A | * | 10/1999 | Fujita et al. | 313/412 |
| 6,150,187 A | * | 11/2000 | Zyung et al. | 438/26 |
| 6,371,200 B1 | * | 4/2002 | Eaton | 165/80.3 |
| 6,570,223 B1 | * | 5/2003 | Machida et al. | 257/347 |
| 6,724,071 B2 | * | 4/2004 | Combs | 257/666 |
| 6,765,249 B2 | * | 7/2004 | Voutsas et al. | 257/288 |

(Continued)

FOREIGN PATENT DOCUMENTS

| | | |
|---|---|---|
| JP | 2002-063985 | 2/2002 |
| KR | 10-2005-0051570 | 6/2005 |

(Continued)

*Primary Examiner* — Mohammad Islam
*Assistant Examiner* — Ankush Singal
(74) *Attorney, Agent, or Firm* — Knobbe Martens Olson & Bear LLP

(57) ABSTRACT

An organic light emitting diode display includes a flexible substrate, an organic light emitting diode disposed over the flexible substrate, and an encapsulation film disposed over the flexible substrate to encapsulate the organic light emitting diode, with the organic light emitting diode interposed between the encapsulation film and the flexible substrate. A thermal conduction layer contacts the flexible substrate, wherein the thermal conduction layer faces the organic light emitting diode and the flexible substrate is interposed between the thermal conduction layer and the organic light emitting diode. A first film is disposed over the encapsulation film, and a second film is disposed over the thermal conduction layer.

6 Claims, 8 Drawing Sheets

(56) References Cited

U.S. PATENT DOCUMENTS

| | | | |
|---|---|---|---|
| 6,923,702 B2* | 8/2005 | Graff et al. | 445/24 |
| 7,087,134 B2* | 8/2006 | Chen et al. | 156/281 |
| 7,211,828 B2* | 5/2007 | Yamazaki et al. | 257/79 |
| 7,372,200 B2* | 5/2008 | Yamazaki | 313/506 |
| 7,420,208 B2* | 9/2008 | Yamazaki et al. | 257/59 |
| 7,648,925 B2* | 1/2010 | Moro et al. | 438/780 |
| 7,745,262 B2* | 6/2010 | Huang et al. | 438/122 |
| 7,825,588 B2* | 11/2010 | Yamazaki et al. | 313/506 |
| 8,187,960 B2* | 5/2012 | Lee et al. | 438/584 |
| 2002/0058103 A1* | 5/2002 | Gu et al. | 427/66 |
| 2003/0038346 A1* | 2/2003 | Beer et al. | 257/666 |
| 2003/0057422 A1* | 3/2003 | Yamazaki et al. | 257/79 |
| 2003/0062519 A1* | 4/2003 | Yamazaki et al. | 257/40 |
| 2003/0113578 A1* | 6/2003 | Omachi et al. | 428/687 |
| 2003/0164497 A1* | 9/2003 | Carcia et al. | 257/40 |
| 2003/0178181 A1* | 9/2003 | Noda et al. | 165/80.3 |
| 2004/0007970 A1* | 1/2004 | Ma et al. | 313/504 |
| 2004/0085019 A1* | 5/2004 | Su et al. | 313/506 |
| 2004/0201027 A1* | 10/2004 | Ghosh | 257/99 |
| 2005/0285520 A1* | 12/2005 | Cok | 313/512 |
| 2006/0081978 A1* | 4/2006 | Huang et al. | 257/706 |
| 2006/0231837 A1* | 10/2006 | Wuchse et al. | 257/59 |
| 2006/0273304 A1* | 12/2006 | Cok | 257/40 |
| 2007/0126328 A1* | 6/2007 | Cho | 313/46 |
| 2007/0170850 A1* | 7/2007 | Choi et al. | 313/506 |
| 2007/0222370 A1* | 9/2007 | Zhu et al. | 313/504 |
| 2007/0259487 A1* | 11/2007 | Park et al. | 438/166 |
| 2008/0068810 A1* | 3/2008 | Watanabe | 361/720 |
| 2008/0090338 A1* | 4/2008 | Tredwell et al. | 438/151 |
| 2008/0211398 A1* | 9/2008 | DeCook et al. | 313/506 |
| 2008/0311361 A1* | 12/2008 | Lee et al. | 428/209 |
| 2009/0004772 A1* | 1/2009 | Jinbo et al. | 438/99 |
| 2009/0008792 A1* | 1/2009 | Ko et al. | 257/774 |
| 2009/0015840 A1* | 1/2009 | Lin et al. | 356/445 |
| 2009/0020592 A1* | 1/2009 | Lee et al. | 228/205 |
| 2009/0115833 A1* | 5/2009 | Soulliaert et al. | 347/238 |
| 2009/0149007 A1* | 6/2009 | Jung et al. | 438/487 |
| 2009/0236707 A1* | 9/2009 | Chen et al. | 257/675 |
| 2010/0089636 A1* | 4/2010 | Ramadas et al. | 174/521 |
| 2010/0155757 A1* | 6/2010 | Kim et al. | 257/98 |
| 2010/0214777 A1* | 8/2010 | Suehiro et al. | 362/235 |
| 2010/0308335 A1* | 12/2010 | Kim et al. | 257/59 |
| 2011/0049591 A1* | 3/2011 | Nakatani et al. | 257/292 |
| 2011/0140100 A1* | 6/2011 | Takata et al. | 257/43 |
| 2011/0233557 A1* | 9/2011 | Yamazaki et al. | 257/71 |
| 2012/0261713 A1* | 10/2012 | Koo et al. | 257/100 |

FOREIGN PATENT DOCUMENTS

| | | |
|---|---|---|
| KR | 10-2005-0073855 | 7/2005 |
| KR | 10-2007-0014692 | 2/2007 |
| KR | 10-0796129 | 1/2008 |
| KR | 10-2008-0104324 | 12/2008 |
| KR | 10-2009-0112387 A | 10/2009 |

* cited by examiner

ORGANIC LIGHT EMITTING DIODE DISPLAY AND METHOD OF MANUFACTURING THE SAME

RELATED APPLICATIONS

This application claims priority to and the benefit of Korean Patent Application No. 10-2009-0110476 filed in the Korean Intellectual Property Office on Nov. 16, 2009, the entire content of which is incorporated herein by reference.

BACKGROUND

1. Field

The described technology relates generally to an organic light emitting diode display, and more particularly, to an organic light emitting diode display with organic light emitting diodes, and a manufacturing method thereof.

2. Description of the Related Technology

Organic light emitting diode (OLED) displays have been recently highlighted as display devices for displaying images. The organic light emitting diode display has a self emissive characteristic, and generally differs from a liquid crystal display (LCD) in that it does not require a separate light source and has relatively small thickness and weight. Furthermore, the organic light emitting diode display exhibits other high quality characteristics, such as low power consumption, high luminance, and short response time.

A flexible organic light emitting diode display in which organic light emitting diodes are formed on a plastic substrate and encapsulated by a thin film has been recently developed. As the flexible organic light emitting diode display generally has very thin thickness overall, films with relatively large thicknesses may be attached to the top and the bottom surfaces of the flexible organic light emitting diode display in order to increase the mechanical strength thereof. In this case, however, it is difficult to dissipate heat generated from the organic light emitting diodes to the outside of the display due to the thick films.

If the heat generated from the organic light emitting diodes is not properly dissipated to the outside of the flexible organic light emitting diode display, the temperature of the flexible organic light emitting diode display can be elevated and cause the flexible organic light emitting display to become defective, and have shortened lifespan or operation failures.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide an organic light emitting diode display and a manufacturing method thereof having the advantages of easily dissipating heat generated from organic light emitting diodes to the outside of the display.

One embodiment provides an organic light emitting diode display including a flexible substrate, an organic light emitting diode disposed over the flexible substrate, and an encapsulation film disposed over the flexible substrate to encapsulate the organic light emitting diode, with the organic light emitting diode interposed between the encapsulation film and the flexible substrate. A thermal conduction layer contacts the flexible substrate, wherein the thermal conduction layer faces the organic light emitting diode and the flexible substrate is interposed between the thermal conduction layer and the organic light emitting diode. A first film is disposed over the encapsulation film, and a second film is disposed over the thermal conduction layer.

The thermal conduction layer may have a higher thermal conduction coefficient than thermal coefficients of the flexible substrate and the second film.

The first film and the second film each may be thicker than the flexible substrate.

The thermal conduction layer may correspond to an entire surface area of the flexible substrate.

The thermal conduction layer may be formed in a plate shape.

The thermal conduction layer may be formed in a net shape.

The second film may have a surface formed with protrusions and depressions.

The flexible substrate may be formed with plastic.

Another embodiment provides a method of manufacturing a light emitting diode display, which includes forming a flexible substrate over a glass substrate, forming an organic light emitting diode over the flexible substrate, and forming an encapsulation film over the organic light emitting diode to encapsulate the organic light emitting diode. The method further includes separating the glass substrate from the flexible substrate, forming a thermal conduction layer on a flat surface of the flexible substrate separated from the glass substrate such that the thermal conduction layer contacts the flexible substrate, coupling a first film to the encapsulation film, and coupling a second film to the thermal conduction layer.

The step of forming the thermal conduction layer may be conducted such that the thermal conduction layer corresponds to an entire surface area of the flexible substrate.

The step of forming the thermal conduction layer may comprise deposition.

The step of forming the thermal conduction layer may comprise adhesion.

The thermal conduction layer may have a higher thermal conduction coefficient than thermal conduction coefficients of the flexible substrate and the second film.

The flexible substrate may comprise a plastic material.

Organic light emitting diode displays and methods of manufacturing the display according to embodiments can enhance the heat dissipation efficiency of the displays.

DETAILED DESCRIPTION

Figure 1:
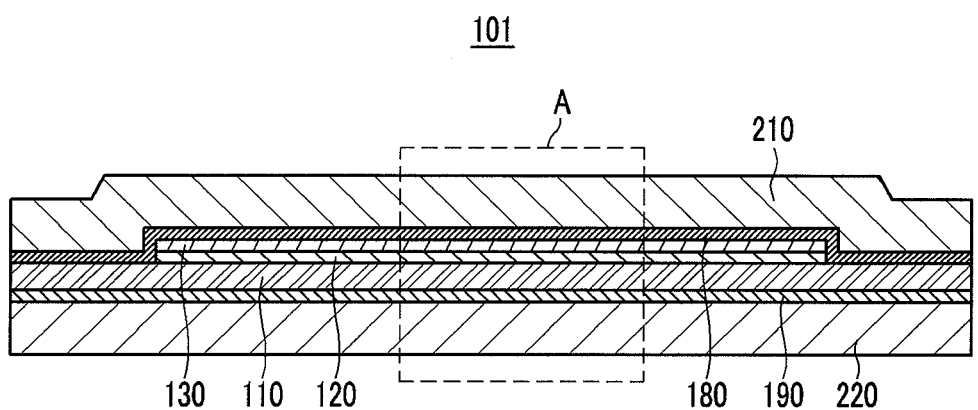
FIG. 1 is a cross-sectional view of an organic light emitting diode display according to a first embodiment.

Embodiments of the present invention will be described more fully hereinafter with reference to the accompanying drawings. As persons skilled in the art would realize, the described embodiments may be modified in various different ways, all without departing from the spirit or scope of the present invention.

Furthermore, detailed description is made on elements in the first embodiment with reference to the relevant drawings by using the same reference numerals for the same elements, while only different constituent elements from those related to the first illustrated embodiment are described in other embodiments. Embodiments of the present invention are not limited to the corresponding drawings, as the size and thickness of the respective structural components shown in the drawings are arbitrarily illustrated for explanatory convenience. In the drawings, the thickness of layers, films, panels, regions, etc., are exaggerated for clarity and convenience. It will also be understood that when an element such as a layer, film, region, or substrate is referred to as being "on" another element, it can be directly on the other element or intervening elements may also be present.

Illustrated in the appended drawings is an active matrix (AM) type of organic light emitting diode display with a 2Tr-1Cap structure where a pixel is provided with two thin film transistors (TFT) and one capacitor, but the present invention is not limited thereto. The organic light emitting diode display is not limited in the number of thin film transistors, capacitors, or wires. A pixel is a minimum image displaying unit, and the organic light emitting diode display displays images through a plurality of pixels.

An organic light emitting diode display 101 according to a first embodiment will now be described with reference to FIG. 1 to FIG. 5.

FIG. 1 is a cross-sectional view of an organic light emitting diode display according to a first embodiment.

As shown in FIG. 1, the organic light emitting diode display 101 according to a first embodiment can include a flexible substrate 110, a driving circuit 120, an organic light emitting diode 130, an encapsulation thin film 180, a thermal conduction layer 190, a first film 210, and a second film 220.

The flexible substrate 110 may be formed as a plastic or resin substrate. The driving circuit 120 and the organic light emitting diode 130 may be formed on the flexible substrate 110.

The driving circuit 120 can include first and second thin film transistors 10 and 20 (shown in FIG. 2), and can drive the organic light emitting diode 130. The organic light emitting diode 130 can emit light in accordance with the driving signals transmitted from the driving circuit 120.

The internal structure of the organic light emitting diode display 101 will now be described in detail with reference to FIG. 2 and FIG. 3.

Figure 2:
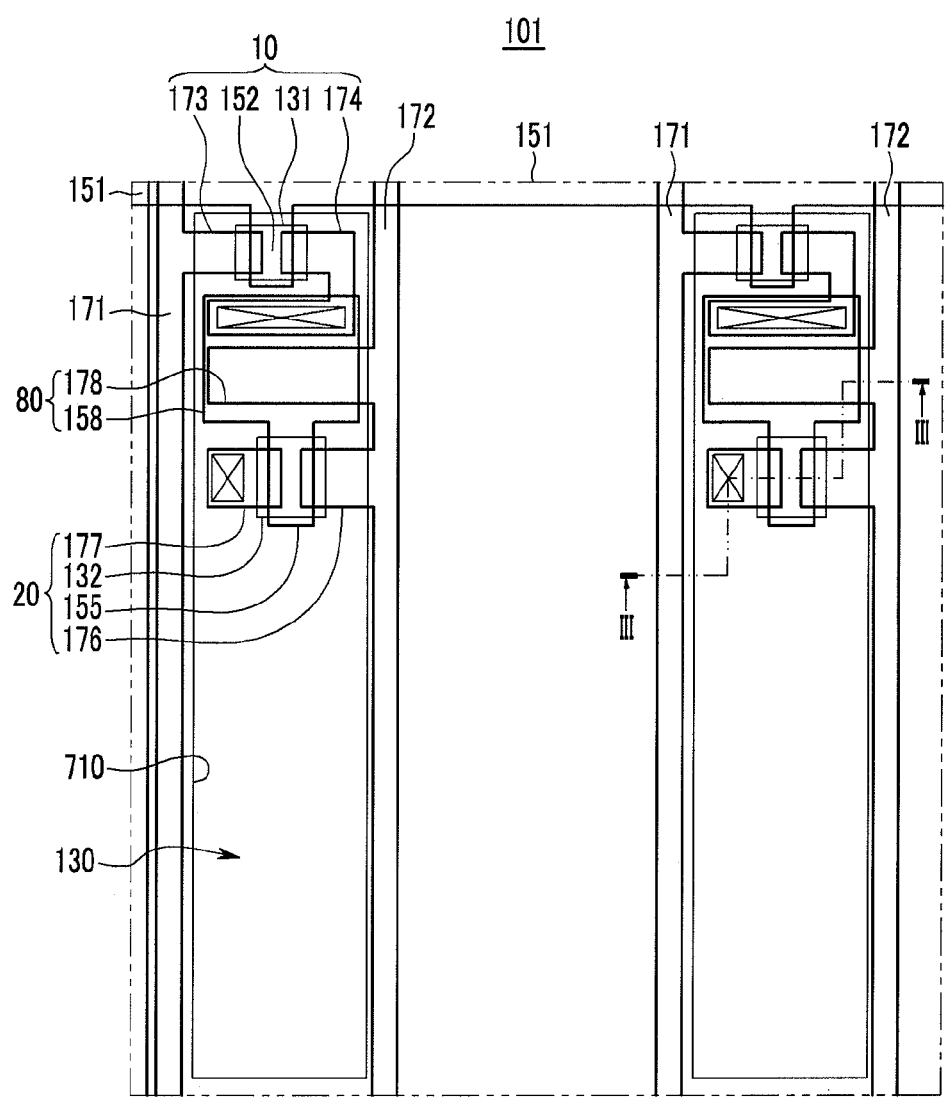
FIG. 2 is a layout view of a pixel structure of an organic light emitting diode display according to a first embodiment.
Figure 3:
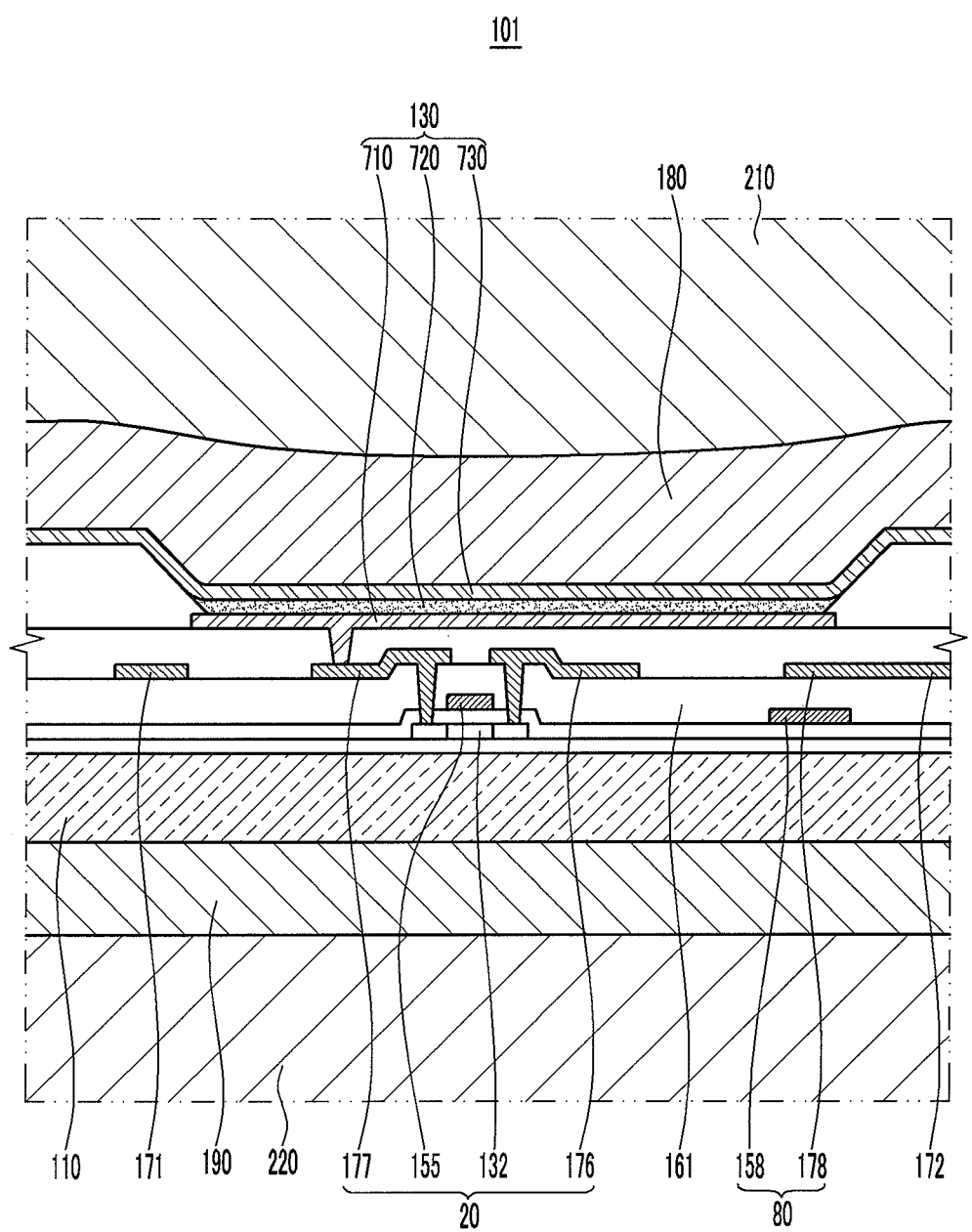
FIG. 3 is a cross-sectional view of the organic light emitting diode display taken along the III-III line of FIG. 2.

The specific structure of the driving circuit 120 and the organic light emitting diode 130 is shown in FIG. 2 and FIG. 3, but embodiments are not limited to the structure shown in FIG. 2 and FIG. 3. The driving circuit 120 and the organic light emitting diode 130 may have various structures provided that a person skilled in the art can easily understand and make such variations.

FIG. 2 is a layout view of a pixel structure of an organic light emitting diode display according to a first embodiment.

FIG. 3 is a cross-sectional view of the organic light emitting diode display taken along the line of FIG. 2.

As shown in FIG. 2 and FIG. 3, the organic light emitting diode display 101 can include a switching thin film transistor 10 formed at each pixel, a driving thin film transistor 20, a capacitor 80, and an organic light emitting diode (OLED) 130. The driving circuit 120 refers to a structure with the switching thin film transistor 10, the driving thin film transistor 20, and the capacitor 80. The driving circuit 120 further can include a gate line 151 proceeding in a direction of the flexible substrate 110, and data and common power lines 171 and 172 crossed the gate line 151 in an insulated manner. Here, one pixel is defined by taking the gate lines 151, the data line 171, and the common power line 172 as a boundary, but is not limited thereto.

The organic light emitting diode 130 can include a first electrode 710, an organic emissive layer 720 formed on the first electrode 710, and a second electrode 730 formed on the organic emissive layer 720. Here, the first electrode 710 can function as a positive (+) electrode being a hole injecting electrode, and the second electrode 730 can function as a negative (−) electrode being an electron injecting electrode. However, embodiments are not necessarily limited thereto, and depending upon the way of driving the display device 101, the first electrode 710 may function as a negative electrode, and the second electrode 730 may function as a positive electrode. Holes and electrons from the first and second electrodes 710 and 730 may be injected into the organic emissive layer 720, and the emission of light from the organic emissive layer 720 can occur when the excitons being combinations of the injected holes and electrons drop from an excited state to a ground state.

With the organic light emitting diode display 101 according to the first embodiment, the organic light emitting diode 130 can emit light in the direction of the encapsulation thin film 180. That is, the organic light emitting diode 130 may be a front emission type. In order to make the organic light emitting diode 130 emit light in the direction of the encapsulation thin film 180, the first electrode 710 may be formed as a reflective electrode and the second electrode 730 may be formed as a transparent or semitransparent electrode. However, in the first embodiment, the organic light emitting diode display 101 is not limited to the front emission type. The organic light emitting diode display 101 may be a rear emission type or a one panel dual emission type.

The capacitor 80 may have a pair of capacitor plates 158 and 178 with an interlayer insulating layer 161 disposed therebetween. The interlayer insulating layer 161 can function as a dielectric, and the capacitance of the capacitor 80 may be determined depending upon the charges at the capacitor 80 and the voltages of the capacitor plates 158 and 178.

The switching thin film transistor 10 can include a switching semiconductor layer 131, a switching gate electrode 152, a switching source electrode 173, and a switching drain electrode 174. The driving thin film transistor 20 can include a driving semiconductor layer 132, a driving gate electrode 155, a driving source electrode 176, and a driving drain electrode 177.

The switching thin film transistor 10 may be used as a switching element for selecting a pixel to be excited. The switching gate electrode 152 is connected to the gate line 151. The switching source electrode 173 may be connected to the data line 171. The switching drain electrode 174 may be spaced apart from the switching source electrode 173 by a distance, and may be connected to one of the capacitor plates (158 in this case).

The driving thin film transistor 20 can apply driving power for exciting the organic emissive layer 720 of the organic light emitting diode 130 within the selected pixel to the first electrode 710. The driving gate electrode 155 may be connected to the capacitor plate 158 connected with the switching drain electrode 174. The driving source electrode 176 and the other capacitor plate 178 may be connected to the common power line 172. The driving drain electrode 177 may be connected to the first electrode 710 of the organic light emitting diode 130 through a contact hole.

The switching thin film transistor 10 may be operated by way of the gate voltage applied to the gate line 151 so as to transmit the data voltage applied to the data line 171 to the driving thin film transistor 20. A voltage corresponding to the difference between the common voltage applied from the common power line 172 to the driving thin film transistor 20 and the data voltage transmitted from the switching thin film transistor 10 may be stored at the capacitor 80, and the current corresponding to the voltage stored at the capacitor 80 can flow to the organic light emitting diode 130 through the driving thin film transistor 20 so as to operate the organic light emitting diode 130.

The encapsulation thin film 180 faces the flexible substrate 110 while interposing the organic light emitting diode 130 therebetween.

Referring to FIG. 1 again, the encapsulation thin film 180 may be placed over the flexible substrate 110 by interposing the driving circuit 120 and the organic light emitting diode 130 therebetween. The encapsulation thin film 180 encapsulates the organic light emitting diode 130, and may be formed with a resin or silica-based inorganic material.

The thermal conduction layer 190 faces the encapsulation thin film 180 while interposing the flexible substrate 110 therebetween.

The thermal conduction layer 190 may face the organic light emitting diode 130 while interposing the flexible substrate 110 therebetween, and may contact the flat surface of the flexible substrate 110. According to an embodiment, the thermal conduction layer 190 corresponds to the entire flat surface of the flexible substrate 110. The thermal conduction layer 190 may be formed with a metal having a high thermal conduction coefficient, such as gold (Au), silver (Ag), copper (Ti), molybdenum (Mo), and aluminum (Al). According to an embodiment, the thermal conduction layer 190 has a high thermal conduction coefficient compared to that of the flexible substrate 110, the first film 210, and the second film 220, and as it contacts the flat surface of the flexible substrate 110 between the flexible substrate 110 and the second film 220, serves to conduct the heat generated from the organic light emitting diode 130 formed on the flexible substrate 110 in the direction of the second film 220. The heat dissipation efficiency of the thermal conduction layer 190 in the organic light emitting diode display 101 according to the first illustrated embodiment will be described later.

Figure 4A:
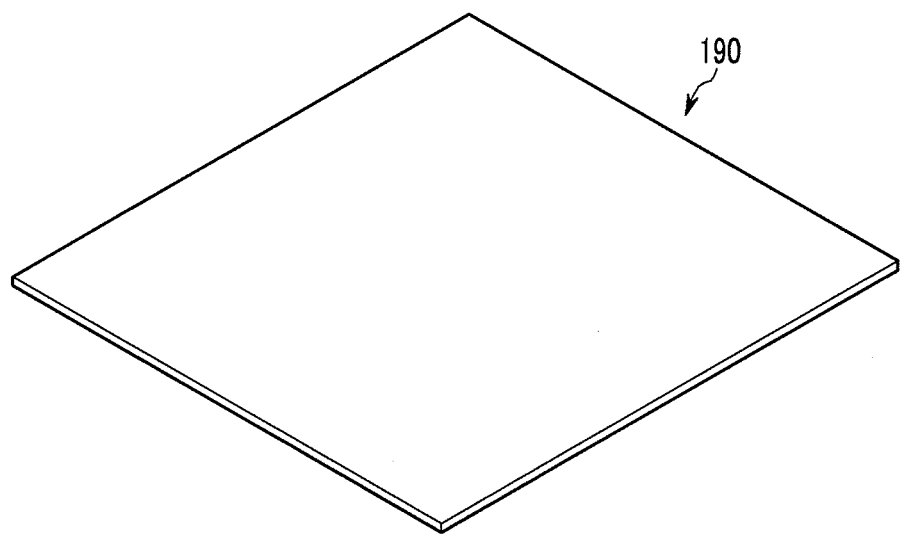
FIG. 4A and FIG. 4B are perspective views of a thermal conduction layer in the organic light emitting diode display according to the first embodiment.
Figure 4B:
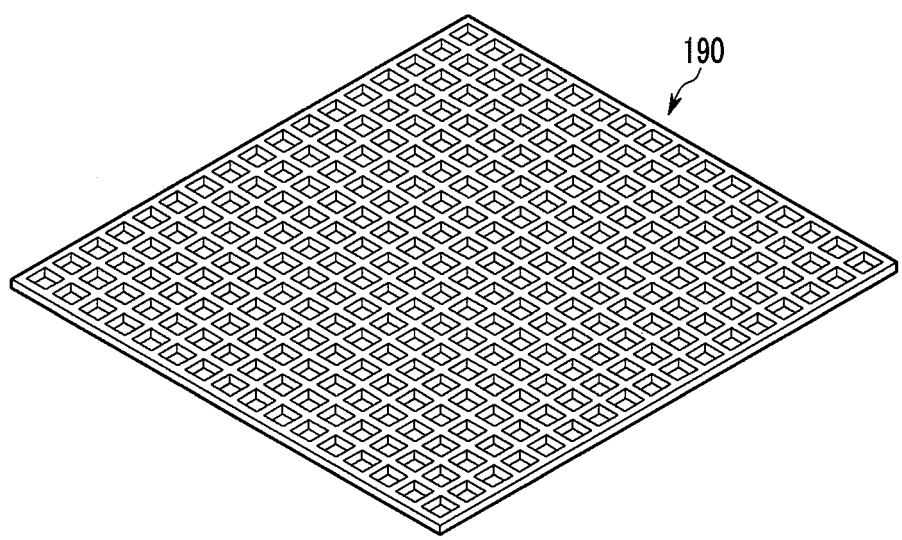

FIG. 4A and FIG. 4B are perspective views of a thermal conduction layer in the organic light emitting diode display according to the first illustrated embodiment. The thermal conduction layer 190 may have a shape of a plate as shown in FIG. 4A, or a net as shown in FIG. 4B.

Referring to FIG. 1 again, the first film 210 may be attached to the encapsulation thin film 180, and may be thicker than the combined thicknesses of the flexible substrate 110, the driving circuit 120, and the organic light emitting diode 130. The first film 210 may cover the flexible substrate 110, the driving circuit 120, and the organic light emitting diode 130 together with the second film 220, and can serve to enhance the mechanical strength of the organic light emitting diode display 101 according to the first illustrated embodiment. The first film 210 may be formed with a resin.

The second film 220 may be attached to the thermal conduction layer 190, and may be thicker than the combined thicknesses of the flexible substrate 110, the driving circuit 120, and the organic light emitting diode 130. The second film 220 can cover the flexible substrate 110, the driving circuit 120, and the organic light emitting diode 130 together with the first film 210, and can serve to enhance the mechanical strength of the organic light emitting diode display 101 according to the first illustrated embodiment. The second film 220 may be formed with a resin.

The heat dissipation efficiency of the organic light emitting diode according to the first embodiment will now be described in detail with reference to FIG. 5.

Figure 5:
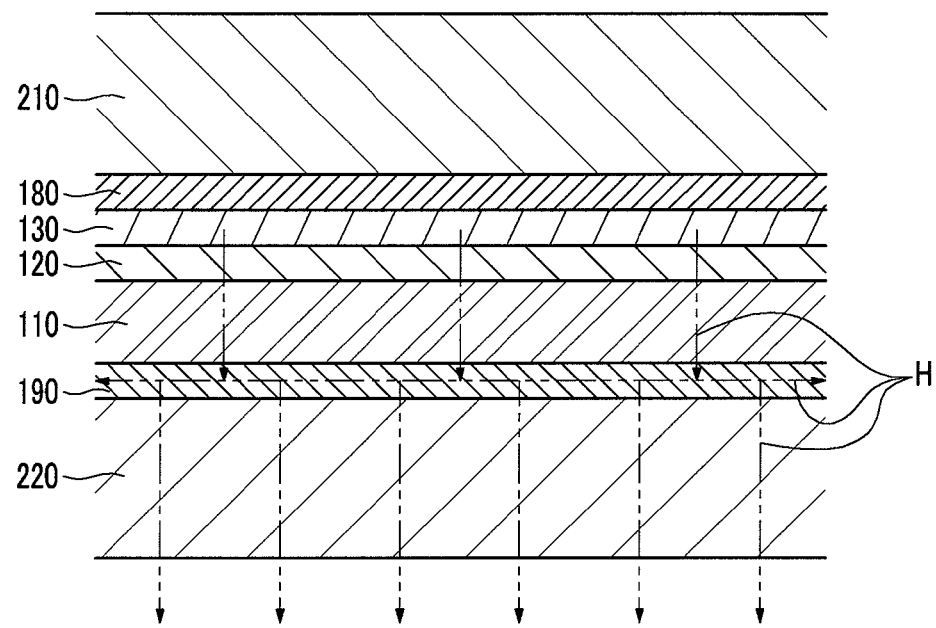
FIG. 5 is an amplified view of the A portion of FIG. 1.

FIG. 5 is an amplified view of the A portion of FIG. 1.

As shown in FIG. 5, the organic light emitting diode display 101 according to the first illustrated embodiment dissipates the heat H generated from the organic light emitting diode 130 to the outside of the display through conduction, radiation, and convection.

Conduction will be described first. Conduction occurs when heat H is conducted at a solid from a high temperature side thereof to a lower temperature side. Conduction may be expressed by Equation 1 below.

$$q = -kA\frac{dT}{dx} \qquad \text{[Equation 1]}$$

In Equation 1, q indicates the amount of thermal energy conducted per hour, k is the thermal conduction coefficient, A is the contact area of the solid, dT is the difference between the temperature of the low temperature solid surface and the temperature of the high temperature surface, and dx is the thickness of the solid.

As shown in the Equation 1, the amount of thermal energy conducted per hour is proportional to the thermal conduction coefficient k and the contact area A.

The thermal conduction layer 190 of the organic light emitting diode display 101 according to the first illustrated embodiment has a high thermal conduction coefficient k compared to the flexible substrate 110 and the second film 220 contacting it, and a wide contact area A because it contacts the entire flat surface of the flexible substrate 110 in the shape of a plate. That is, with conduction, the amount of thermal energy q generated from the organic light emitting diode 130 to the thermal conduction layer 190 via the flexible substrate 110 increases.

Furthermore, the heat H conducted to the thermal conduction layer 190 may be uniformly scattered over the entire internal area of the thermal conduction layer, and the scattered heat H may be uniformly transferred to the second film 220 attached to the thermal conduction layer 190.

Radiation will now be described. Radiation occurs when radiant heat is generated from an object to the exterior of the object depending upon the temperature of the object. The radiation is expressed by Equation 2 below.

$$P = \delta BT^4 \qquad \text{[Equation 2]}$$

In Equation 2, P indicates the amount of thermal energy radiated per hour, d is Stefan's constant, B is the surface area of the object, and T is the temperature of the object. According to Equation 2, radiation is proportional to the surface area B of the object.

For the organic light emitting diode display 101 according to the first illustrated embodiment, as heat H generated from the organic light emitting diode 130 is uniformly transferred to the entire area of the second film 220 by way of the thermal conduction layer 190, radiation can occur not only on a localized surface of the second film 220 but on the entire surface thereof. That is, with the organic light emitting diode display 101 according to the first illustrated embodiment, the radiation occurs from the wide surface area B so that the amount of thermal energy P radiated from the second film 220 to the outside of the display per hour increases.

In short, after heat H locally generated from the organic light emitting diode 130 is conducted to the thermal conduction layer 190 via the flexible substrate 110, it is be conducted through the entire area of the thermal conduction layer 190 corresponding to the whole flexible substrate 110 and through the entire area of the second film 220 so that the radiation occurs on the entire surface of the second film 220. Thus, the amount of thermal energy P radiated from the second film 220 to the outside of the display per hour increases.

Convection will now be described. Convection occurs when a hot portion of liquid or gas moves upwards, while a cool portion thereof moves downwards. That is, with the convection phenomenon, heated air or fluid flows so as to transfer heat H.

For the organic light emitting diode display 101 according to the first illustrated embodiment, heat H may be radiated from the organic light emitting diode display 101 to the near external space through radiation, and move to a far external space through convection so that the heat dissipation of the organic light emitting diode display 101 with respect to the organic light emitting diode 130 is conducted.

As described above, the organic light emitting diode display 101 according to the first illustrated embodiment has a thermal conduction layer 190 disposed between the flexible substrate 110 and the second film 220 so that the amount of thermal energy flowing through conduction and radiation in the organic light emitting diode display 101 increases. That is, the organic light emitting diode display 101 according to the first illustrated embodiment has a thermal conduction layer 190 so that the heat dissipation efficiency with respect to the organic light emitting diode 130 is enhanced.

An organic light emitting diode display 101 according to a second embodiment will now be described with reference to FIG. 6.

Figure 6:
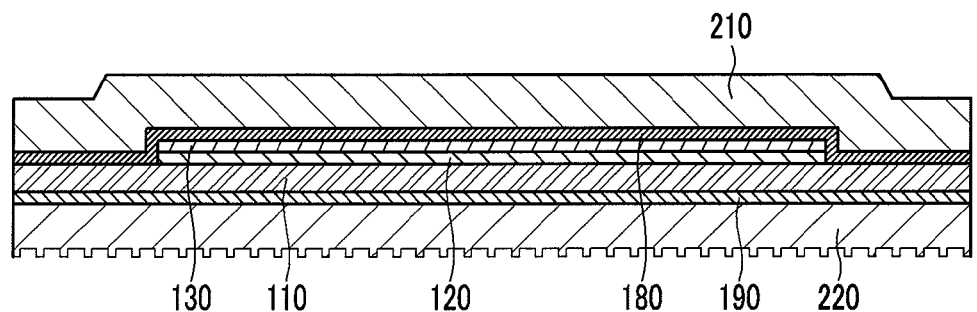
FIG. 6 is a cross-sectional view of an organic light emitting diode display according to a second embodiment.

FIG. 6 is a cross-sectional view of an organic light emitting diode display according to a second embodiment.

As shown in FIG. 6, with the organic light emitting diode display 102 according to the second embodiment, the surface of the second film 220 contacting the external air is formed with protrusions and depressions.

According to Equation 2, radiation is proportional to the surface area B of the object.

For the organic light emitting diode display 102 according to the second illustrated embodiment, as the heat generated from the organic light emitting diode 130 is uniformly transferred to the entire area of the second film 220 by way of the thermal conduction layer 190, the radiation can occur not only on a localized surface of the second film 220 but on the entire surface thereof. As the surface of the second film 220 may be formed with protrusions and depressions, the surface of the second film 220 can have a wide surface area B so that the amount of thermal energy P radiated from the second film 220 to the outside per hour increases.

As described above, for the organic light emitting diode display 101 according to the second illustrated embodiment, the surface of the second film 220 is formed with protrusions and depressions so that the surface area B of the second film 220 is increased and the amount of thermal energy radiated from the second film 220 to the outside per hour increases. That is, the organic light emitting diode display 102 according to the second illustrated embodiment involves enhanced heat dissipation efficiency with respect to the organic light emitting diode 130.

A method of manufacturing the organic light emitting diode display 101 according to the first illustrated embodiment will be now described with reference to FIG. 7 to FIG. 11.

Figure 7:
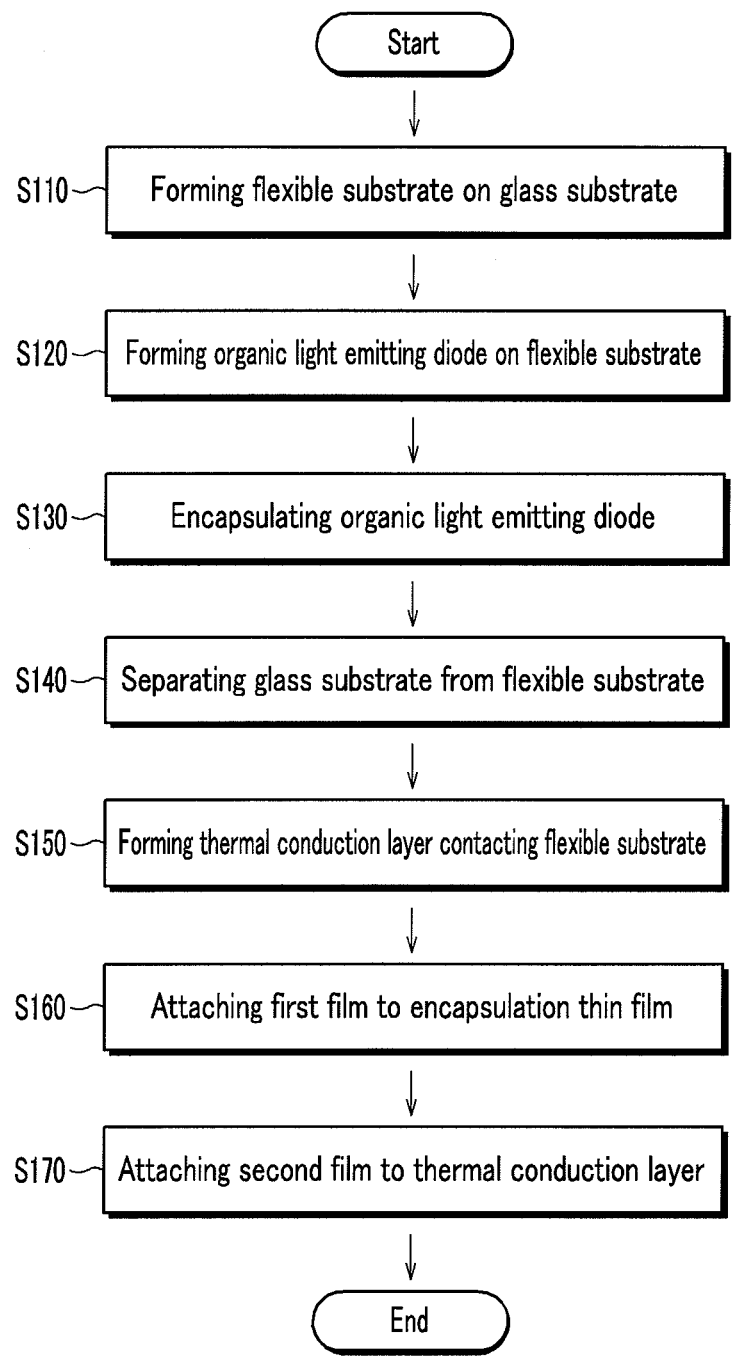
FIG. 7 is a flowchart illustrating a method of manufacturing the organic light emitting diode display according to the first embodiment.

FIG. 7 is a flowchart illustrating the steps of processing the organic light emitting diode display according to the first illustrated embodiment. FIG. 8 to FIG. 11 illustrate a method of manufacturing the organic light emitting diode display according to the first illustrated embodiment.

Figure 8:
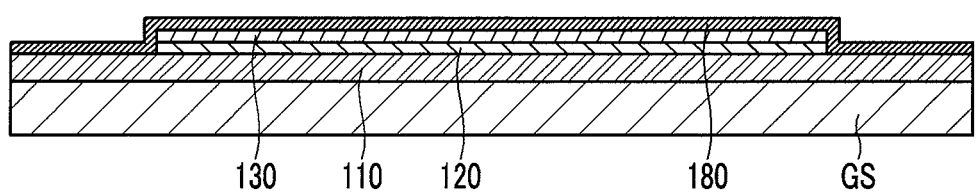
FIG. 8 to FIG. 11 illustrate a method of manufacturing the organic light emitting diode display according to the first embodiment.

First, as shown in FIG. 7 and FIG. 8, a flexible substrate 110 may be formed on a glass substrate GS at step S110.

Specifically, a plastic or resin material may be coated onto a glass substrate GS through spin coating so as to form a flexible substrate 110.

A driving circuit 120 and an organic light emitting diode 130 may be formed on the flexible substrate 110 at step S120.

Specifically, a driving circuit 120 and an organic light emitting diode 130 may be formed on the flexible substrate 110 through microelectromechanical systems such as photolithography.

Then, an encapsulation thin film 180 may be formed on the organic light emitting diode 130 to thereby encapsulate the organic light emitting diode 130 at step S130.

Specifically, an encapsulation thin film 180 may be formed on the organic light emitting diode 130 through deposition, adhesion, or coating so as to encapsulate the organic light emitting diode 130.

Figure 9:
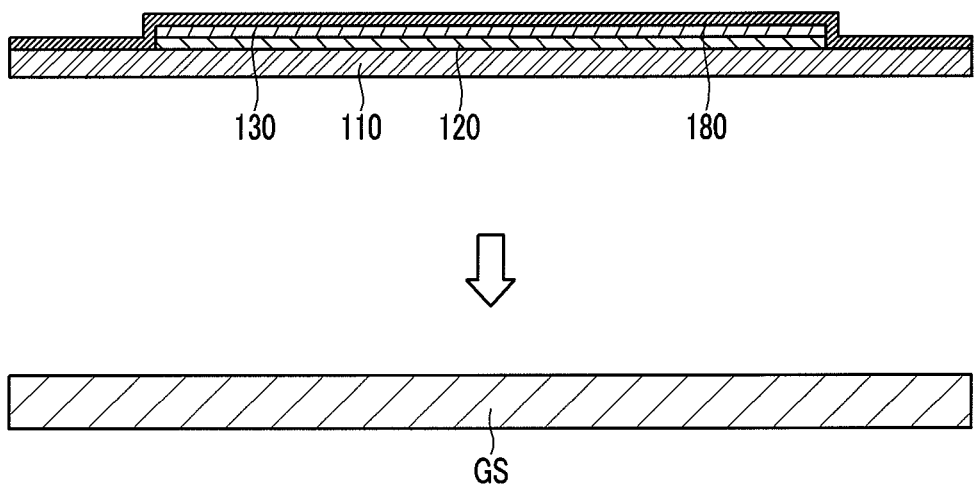

Then, as shown in FIG. 9, the glass substrate GS may be separated from the flexible substrate 110 at step S140.

Specifically, when the glass substrate GS is separated from the flexible substrate 110, they may be detached from each other, or an etching solution that is capable of selectively etching only the glass substrate GS may be used to etch the glass substrate GS.

Figure 10:
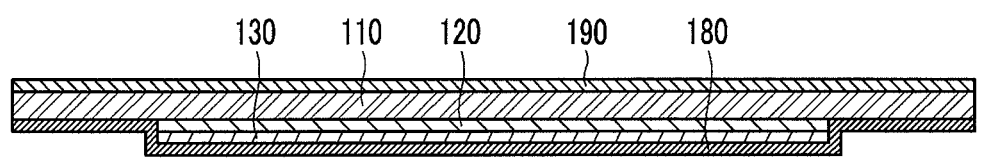

Then, as shown in FIG. 10, a thermal conduction layer 190 may be formed on the flat surface of the flexible substrate 110 such that it contacts the flexible substrate 110 at step S150.

Specifically, a thermal conduction layer 190 may be formed on the entire flat surface of the flexible substrate 110 that is separated from the glass substrate GS such that it contacts the flexible substrate 110. The thermal conduction layer 190 may be deposited onto the flat surface of the flexible substrate 110 through chemical vapor deposition (CVD), or attached onto the flat surface of the flexible substrate 110 through adhesion.

Figure 11:
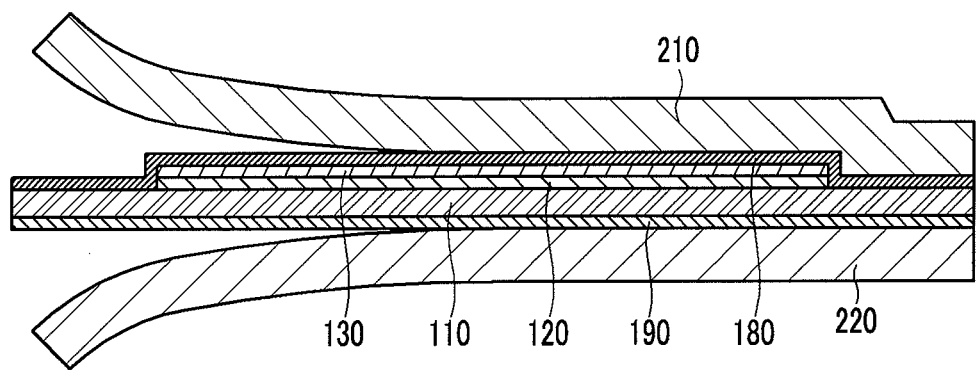

Then, as shown in FIG. 11, a first film 210 may be attached to the encapsulation thin film 180 at step S160.

Specifically, the first film 210 contacting the encapsulation thin film 180 may be attached to the encapsulation thin film 180 through adhesion.

A second film 220 may then be attached to the thermal conduction layer 190.

Specifically, the second film 220 contacting the thermal conduction layer 190 may be attached to the thermal conduction layer 190 through adhesion.

With the above-described process, the organic light emitting diode display according to the first illustrated embodiment is completed.

While this disclosure has been described in connection with what is presently considered to be practical embodiments, it is to be understood that the invention is not limited to the disclosed embodiments, but on the contrary, is intended to cover various modifications and equivalent arrangements included within the spirit and scope of the appended claims.

What is claimed is:

1. A method of manufacturing a light emitting diode display, the method comprising:
forming a flexible substrate over a glass substrate;
forming an organic light emitting diode over the flexible substrate;
forming an encapsulation film over the flexible substrate to encapsulate the organic light emitting diode;
separating the glass substrate from the flexible substrate;
forming a perforated thermal conduction layer on a flat surface of the flexible substrate separated from the glass substrate such that the perforated thermal conduction layer contacts the flexible substrate;
coupling a first film to the encapsulation film; and
coupling a second film to the thermal conduction layer, wherein the perforated thermal conduction layer has a plurality of perforations disposed in a portion of the thermal conduction layer in contact with the flexible substrate.

2. The method of claim 1, wherein the step of forming the thermal conduction layer comprises forming the thermal conduction layer to correspond to an entire surface area of the flexible substrate.

3. The method of claim 2, wherein the step of forming the thermal conduction layer comprises deposition.

4. The method of claim 2, wherein the step of forming the thermal conduction layer comprises adhesion.

5. The method of claim 1, wherein the thermal conduction layer has a higher thermal conduction coefficient than thermal conduction coefficients of the flexible substrate and the second film.

6. The method of claim 5, wherein the flexible substrate comprises a plastic material.

* * * * *